United States Patent [19]

Galloway et al.

[11] Patent Number: 5,703,928

[45] Date of Patent: Dec. 30, 1997

[54] PROBE FOR SAMPLING DIFFERENTIAL ELECTROMAGNETIC FIELDS

[75] Inventors: George G. Galloway, Graford; Paul R. Siglinger, Weatherford, both of Tex.

[73] Assignee: Industrial Technology, Inc., Mineral Wells, Tex.

[21] Appl. No.: 533,844

[22] Filed: Sep. 26, 1995

[51] Int. Cl.⁶ .................... H04M 1/00; G01R 31/08
[52] U.S. Cl. .................... 379/21; 375/224; 324/515; 324/690; 324/754
[58] Field of Search .................... 379/1, 22, 21, 379/27, 28, 34; 375/224, 228; 324/512, 515, 519, 754, 539, 690; 178/18, 19; 345/179, 180

[56] References Cited

U.S. PATENT DOCUMENTS

| | | | |
|---|---|---|---|
| 3,729,597 | 4/1973 | Garrett et al. | 379/21 |
| 5,140,614 | 8/1992 | Buzbee et al. | 375/224 |
| 5,274,336 | 12/1993 | Crook et al. | 324/690 |
| 5,461,204 | 10/1995 | Makinwa et al. | 178/19 |
| 5,512,838 | 4/1996 | Roach | 324/754 |
| 5,565,788 | 10/1996 | Burr et al. | 324/754 |

*Primary Examiner*—Curtis Kuntz
*Assistant Examiner*—Paul Loomis
*Attorney, Agent, or Firm*—Geoffrey A. Mantooth

[57] ABSTRACT

A probe for use in sampling signals from a pair of telephone wires has two conductors that are separated from each other by an insulating material such as a circuit board. Each of the conductors has an overall size and has plural nonconductive interstices therein so as to reduce the capacitance of the probe. In one embodiment, each of the conductors is shaped like a comb having conductive strips. Each of the conductors could alternatively be shaped in a zig zag manner. The telephone wires are oriented parallel to the strips so as to enhance coupling therebetween. The probe can have plural channels thereon, such as two conductors on each side of the insulating material. The strips of one conductor are located in the gaps of the other conductor which on the same side of the insulating material. The probe can reduce common mode noise by being balanced. A grounded guard trace on each side of the insulating material snubs homogeneous electric fields.

19 Claims, 8 Drawing Sheets

PROBE FOR SAMPLING DIFFERENTIAL ELECTROMAGNETIC FIELDS

FIELD OF THE INVENTION

The present invention relates to apparatuses and methods for sampling differential electromagnetic fields such as are found near telephone cables.

BACKGROUND OF THE INVENTION

Telephone systems in general use both copper wires and optical fibers to carry telephone signals. Much of the physical equipment already in place is copper wire and its associated equipment. Traditionally, a pair of copper wires was used to carry only a single conversation. Nowadays, a single pair of copper wires can carry multiple conversations by way of multiplexing. Multiplexing increases the capacity of the telephone system by allowing the system to carry more calls. One type of multiplexing uses a digital carder signal. The audio information is digitized and sent over the wires on the digital carrier. Examples of standard digital carders that have been adopted by the telephone industry are T-1 and T-2. These are pulse code modulation carriers.

Field technicians working on a telephone cable of copper wires must frequently locate those particular copper wires in the cable bundle that have carder signals on them. The field technician may be tracing a particular pair wires or he may be attempting to locate an unused pair, that is a pair without a carder signal thereon, in the cable. He can then use this unused pair to communicate with other technicians along the cable.

At voice frequencies, where a pair of copper wires carries only a single conversation, the technician can use simple test equipment to detect a pair that is in service. The test equipment may either capacitively or inductively load the wire pair. At voice frequencies (about 200–3200 Hz), this acceptable because there is little or no degradation of service. However, at the higher frequencies used by digital carders (772 KHz on up), such loading by test equipment can cause degradation and interruption of telephone services on the wire pair. Thus, some type of non-invasive equipment must be used when testing a pair of wires to determine the presence or absence of a digital carrier.

The assignee of the subject invention holds two patents regarding the detection of digital carder signals on telephone cables. These patents, which are U.S. Pat. Nos. 5,140,614 and 5,297,167, describe a detection device that includes a capacitive probe that is inserted between the two wires in a pair. The capacitive probe is connected to a differential amplifier. This arrangement enhances the signal of interest (that is, a signal that is deliberately placed on a wire pair), while tending to cancel undesirable signals (signal such as common mode noise that are induced onto both wires in a pair). The detection device described in the patents has proven to be a significant advance over the then existing state of the art.

The original capacitive probe tip of the detection device consists of a pair of conducting plates located on the end of printed circuit board 11. FIG. 1 shows a plan view of this probe 13. One of the plates 15 is shown, while the other plate (not shown) is located behind (with reference to the orientation of FIG. 1) the visible plate and on the back side of the printed circuit board.

The FIG. 1 design of the probe 13 has worked satisfactorily by achieving a high capacitance between the probe plates and the wires being sampled. However, we have learned that this design also achieves a high capacitance between the probe plates 15 themselves.

Such a high capacitance between the probe plates 15 acts as a load on the probe and limits the magnitude of the signal that can be passed from the probe onto the sensing electronics. To illustrate this, FIG. 2 shows a schematic electrical circuit equivalent diagram of a capacitive probe 13 inserted between a pair of telephone wires (ring 17, tip 19). Each telephone wire has time-varying voltage 21, 23 impressed thereon. Thus, the ring wire 17 has a ring voltage 21 and the tip wire 19 has a tip voltage 23. The ring and tip wires also each have a series resistance 25, 27. There is a capacitance 29 between the ring wire 17 and the probe 13. There is also capacitance 31 between the tip wire 19 and the probe 13. Connected across the probe capacitance 13 is the sensing electronics 33, which has an impedance. An ideal probe 13 would have an infinite impedance in order to pass on all the signal collected by the probe 13 to the sensing electronics 33. A high impedance for the probe 13 is accomplished by a lower capacitance (wherein the capacitance equals zero) between the plates 15.

FIG. 3 shows a prior art attempt to lower the capacitance (and raise the impedance) of the probe 13A. Conductive material (copper) was removed from the edge areas 35 of the probe plates 15A to make the plates have a more pointed end. The outline of the plate 15 of FIG. 1 is shown by dashed lines in FIG. 3. This reduction of copper did in fact help in reducing the capacitance between the probe tip plates themselves. But it also reduced the capacitive coupling between the tip and ring wires and the probe tip 13A thus making the probe less efficient (and less sensitive) in collecting a signal. This reduction in capacitive coupling was more pronounced at the pointed end portion of the probe. The base of the probe, which is more rectangular, has a better capacitive coupling to wires. With human nature being what it is, the pointed end is typically used when a field technician is looking for a pair of wires, because it is faster (that is, the probe is not fully inserted to its base between the wires).

In addition, the probe should exhibit an ability to reject common-mode signals. Such signals are typically noise and are present on both the tip wire and the ring wire. Common mode signals are coupled to a wire pair by adjacent wire pairs. Common mode signals make detecting an in service wire pair difficult because the wire pair appears to be carrying a signal, when in fact the pair is not.

SUMMARY OF THE INVENTION

It is an object of the present invention to provide a probe that has a high coupling for collection of a signal from a wire pair and yet has a high impedance so as to pass on much of the collected signal to detecting equipment.

It is a further object of the present invention to provide a probe that reduces the capacitance of the probe itself, while maintaining a high capacitive coupling between the probe and the wires being probed.

It is another object of the present invention to provide a probe that rejects common-mode noise signals.

The probe of the present invention is for use in sensing electromagnetic fields. The probe includes two conductors that are separated from each other. An insulating material is located between the conductors. Each of the conductors includes a set of conducting strips. Each of the strips in a respective set is separated from adjacent strips in same set by gaps that are electrically isolated from the adjacent strips. Each of the conductors includes a connecting conductor that conductively couples the strips in a respective set together at some portion along a length of the strips.

In another aspect of the present invention, the probe is part of a circuit board that has a probe area and an electronics area. The probe area has a first surface and an opposite second surface. The first surface has a first conductive plate and the second surface has a second conductive plate. Each of the first and second conductive plates have an overall size and plural nonconductive interstices located therein. The electronics area is integral to the probe area and is structured and arranged to receive sensing electronics for use in processing a signal collected by the first and second conductive plates.

The present invention provides an improved probe for detecting signals on wires. The capacitance of the probe itself has been reduced by providing nonconductive interstices or gaps in the conductive material forming the plates, while retaining the overall size and shape of the conductive plates. Thus, the impedance of the probe is high so as to pass more of the collected signal to the sensing electronics. (A low impedance probe would retain more of the signal.) The higher impedance improves the sensitivity of the probe. The capacitve coupling between the probe and the wires being probed is maintained by preserving the overall size of the conductive plates.

In one aspect of the present invention, each of the conductors is shaped like a comb having a spine and teeth projecting from the spine. The respective connecting conductor forms the spine of the comb and the respective sets of strips form the teeth. Alternatively, each of the conductors includes a zig zag conductor.

In still another aspect of the present invention, the capacitance between the two conductors is further decreased by staggering the strips of one of the conductors with respect to the strips of the other conductor. The staggering increases the distance between the respective strip of the respective conductors thus raising the impedance of the probe. In still another aspect of the present invention, the strips have a width that is less than a width of the gaps between the strips.

The probe is capable of rejecting common-mode noise. Common mode noise that is on a wire pair is rejected by the two conductors being electrically identical and symmetrical and being connected to inputs of a differential amplifier.

Homogenous fields that are ambient in the vicinity of use are reduced with guard conductors. There is a guard conductor adjacent to each of the two conductors, with the guard conductors being connected to a circuit ground. The guard conductors serve to snub the homogenous fields.

In accordance with still another aspect of the present invention, plural channels can be provided for the probe to improve probe sensitivity over different signal frequencies. The two conductors include a first electrical channel. Two second electrical channels are provided, which are parallel to each other and which are separated from each other by the insulating material. Each of the second channel conductors includes a set of second channel conducting strips that are parallel to each other and separated from each other by second channel gaps. The second channel strips are located in the gaps of the first channel conductors. Thus, the strips of the first and second channel conductors are interdigitated with one another.

Two third channel conductors are provided, which third channel conductors are parallel to each other and are separated from each other by the insulating material. Each of the third channel conductors includes a zig zag conductor that is located in the respective first channel gaps and in the respective second channel gaps.

A set of fourth channel conductors can be provided around the periphery of the first, second, and third channel conductors. The fourth channel conductors can be connected to circuit ground, wherein they serve as a snub for homogeneous electric fields. Alternatively, the fourth channel conductors can be connected to inputs of sensing electronics, wherein the fourth channel conductor serve as a non-differential audio probe.

The present invention also provides a method of sensing a signal on a pair of wires. A probe having two comb shaped conductors that are separated from each other is provided. The comb shaped conductors have conductive parallel teeth. The probe is inserted between the wires in the pair such that the wires are parallel to the conductive teeth. A portion of the signal from the pair of wires is collected with the probe.

DESCRIPTION OF PREFERRED EMBODIMENTS

Figure 1:
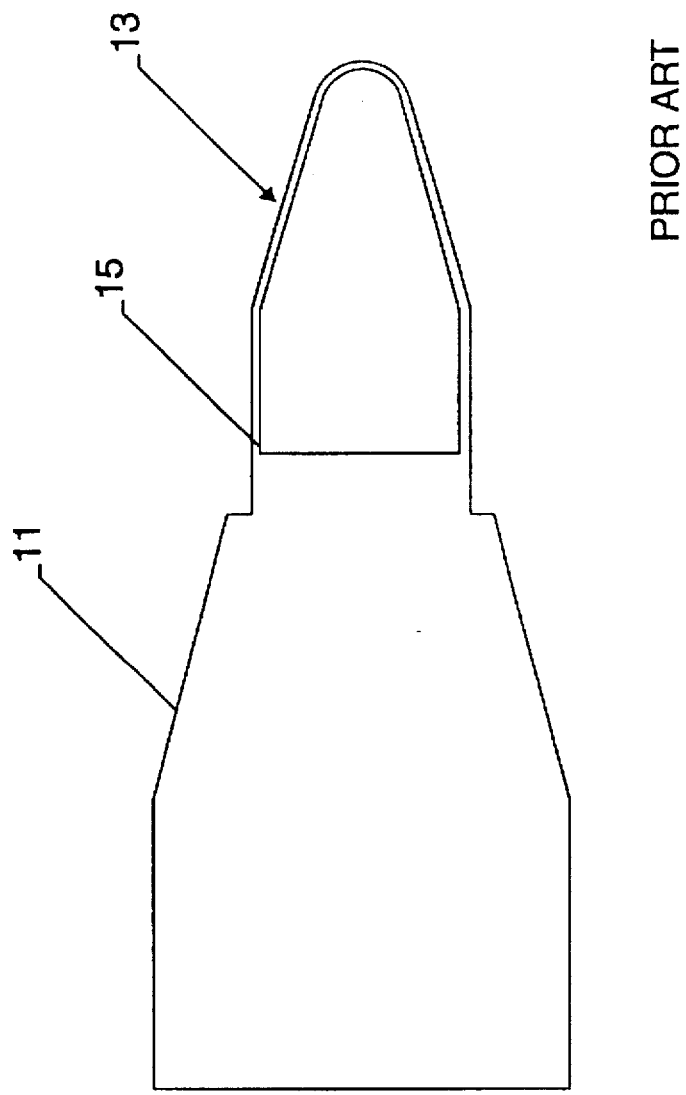
FIG. 1 is a plan view of a printed circuit board showing a prior art probe.
Figure 2:
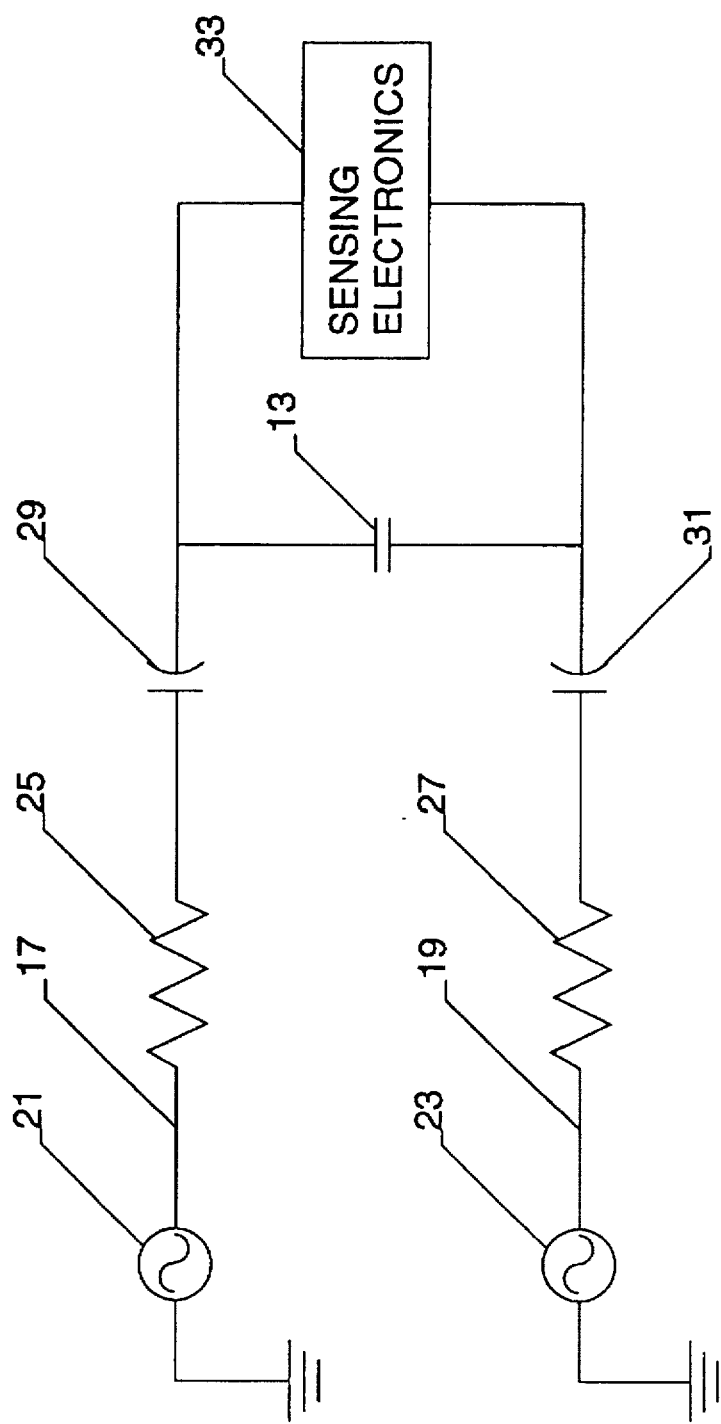
FIG. 2 is an electrical schematic diagram showing an equivalent circuit of a probe inserted between a pair telephone wires.
Figure 3:
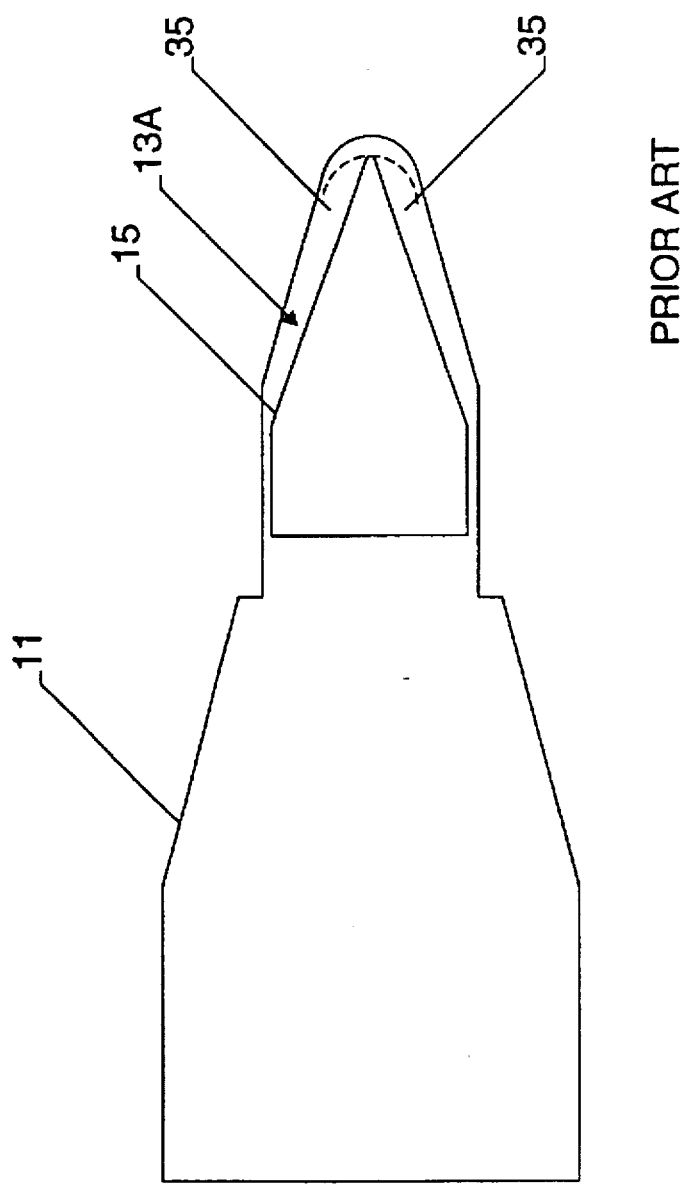
FIG. 3 is a plan view of a printed circuit board showing another prior art probe.
Figure 4:
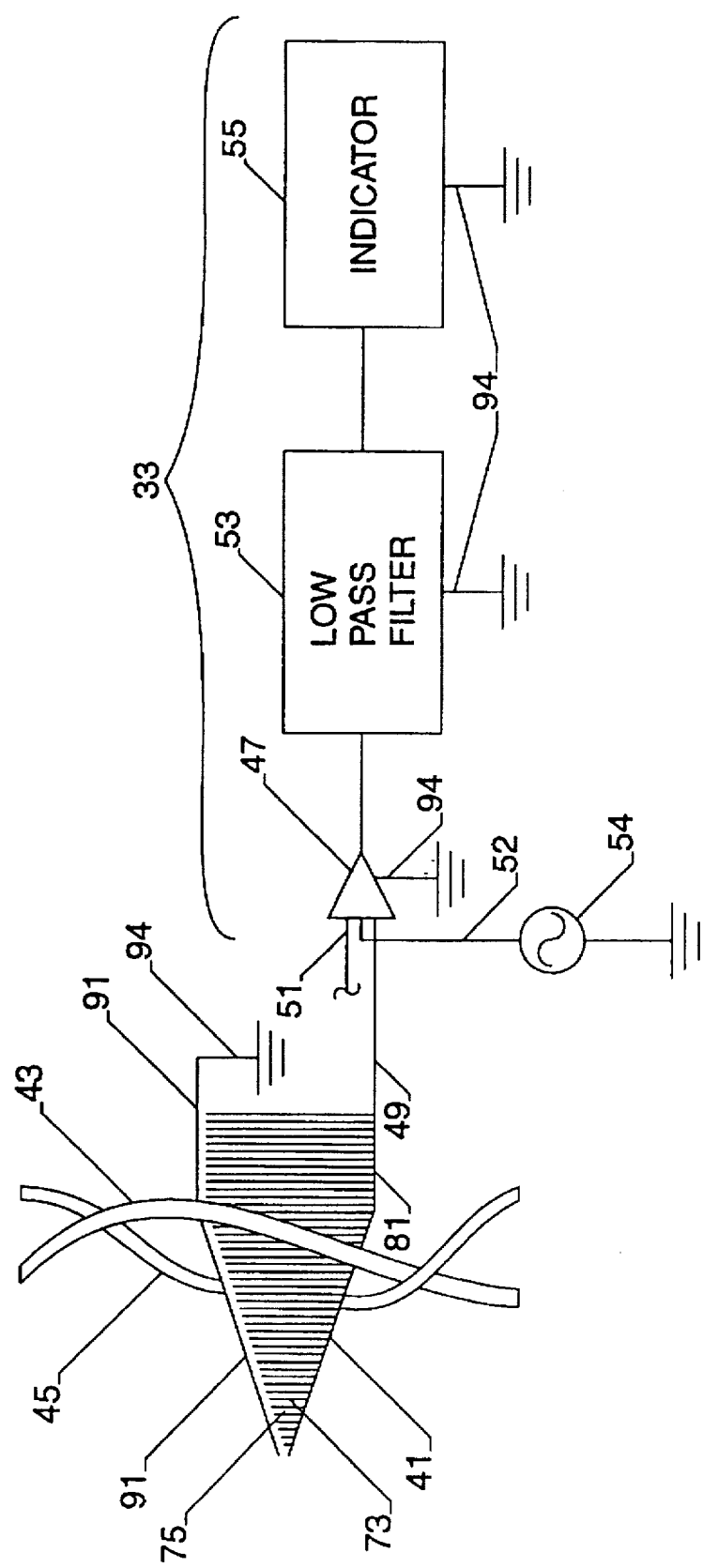
FIG. 4 is an electrical schematic of the probe of the present invention and its associated electronics, in use in sensing a signal on a pair of wires.

Referring to FIG. 4, the probe 41 is used to locate a particular pair of wires 43, 45 in a bundle of wires. The pair of wires 43, 45 carries a signal (such as a T-1 signal) thereon. The probe 41 has two plates (only one of which is shown in FIG. 4 for simplicity). The probe 41 is inserted between the tip wire 43 and the ring wire 45 of the pair. Any signal that is present on the pair of wires is capacitively coupled to the probe 41. The coupled signal is then passed to sensing electronics 33. In the preferred embodiment, the sensing electronics 33 includes a balanced differential amplifier 47. One input 49 of the amplifier 47 is connected to one of the plates of the probe, while the other input 51 of the amplifier is connected to the other plate of the probe. The amplifier 47 serves as a mixer and has a third input 52 coupled to an oscillator 54 that is tuned to within one or two Kilohertz of the desired signal. The output of the amplifier 47 is connected to a low pass filter 53, which in turn is connected to an indicator 55. The indicator 55 provides an indication of a detected signal to a human operator. U.S. Pat. Nos. 5,140,614 and 5,297,167 disclose the electronics in more detail. The disclosures of U.S. Pat. Nos. 5,140,614 and 5,297,167 are incorporated herein by reference.

Figure 6:
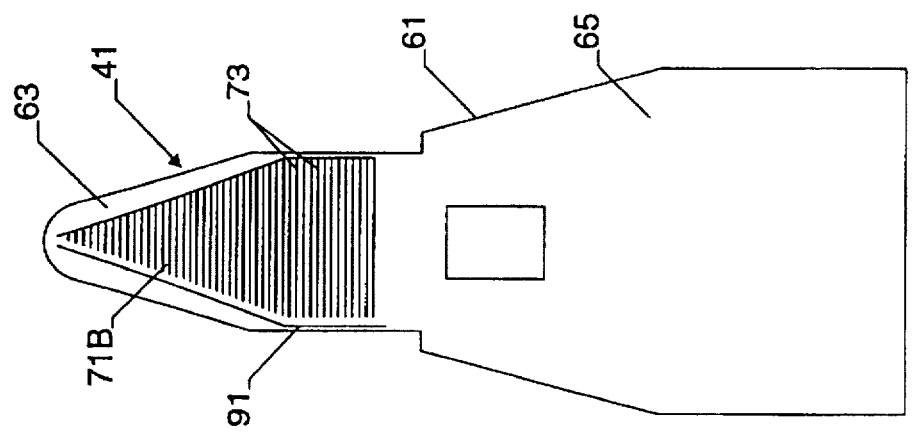
FIG. 6 is a bottom plan view of the printed circuit board of FIG. 5, showing the other side of the probe.
Figure 5:
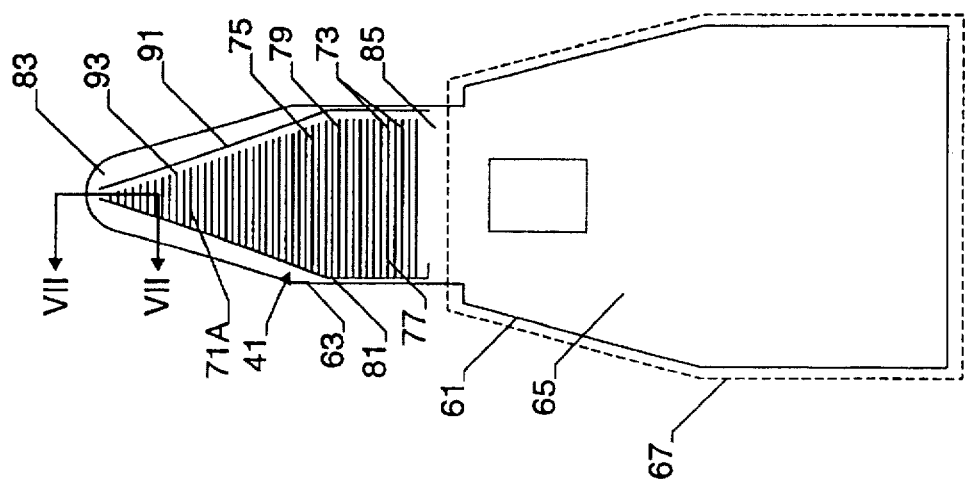
FIG. 5 is a top plan view of printed circuit board showing one side of the probe of the present invention, in accordance with a preferred embodiment.

In the preferred embodiment, the probe is incorporated into a printed circuit board 61. FIGS. 5 and 6 show respective top and bottom plan views of the printed circuit board 61. The circuit board 61 has two portions, namely a probe area 63 and an electronics area 65. The probe area 63 contains the capacitive probe 41, while the electronics area 65 contains the sensing electronics 33 (shown in FIG. 4).

The circuit board 61 is housed in a case 67 (which is represented by dashed lines in FIG. 5). Specifically, the case 67 encloses the electronics area 65 and the accompanying electronics 33, while the probe 41 extends outwardly from the case so as to be exposed. This allows the probe 41 to be inserted between a pair of wires, such as is shown in FIG. 4.

The probe 41 has two plates, namely a top plate 71A and a bottom plate 71B (referring to the orientations provided in FIGS. 5 and 6). The plates 71A, 71B are separated from each by the insulation material of the circuit board 61. Thus, one of the plates is on one surface of the circuit board, while the other of the plates is on the opposite surface of the circuit board. Each plate has an overall size, which size is indicative of the area of the plate. Capacitance of the plates is determined by $C = \epsilon A/d$, where $\epsilon$ where is permittivity, A is area of the plates, and d is the distance between the plates. One portion of each plate, the tip, is shaped like a triangle. The other portion of each plate, the base, is shaped like a rectangle. Thus, the overall size (or area) of each plate is defined by its triangular portion and its rectangular portion. Each plate has interstices or gaps therein. These interstices reduce the capacitance between the plates while maintaining the overall size of the plates.

In the preferred embodiment, each plate is made up of plural conductive strips or fingers 73. Each finger 73 in a plate is separated from its adjacent fingers by gaps 75. The gaps 75 are filled with a material that is not electrically connected to the plates 71A, 71B. In FIGS. 5 and 6, the gaps 75 are nonconductive spaces between the fingers 73.

Each finger 73 has a length, that extends between first and second ends 77, 79, and a width. The width of each finger 73 is narrow so that each finger is like a wire. In the preferred embodiment, the width of each finger 73 is less than or equal to the width of the gaps 75.

The fingers 73 of each plate 71A, 71B are all electrically connected together by a common conductor 81 extending along the first end 77 of the fingers. Thus, the fingers 73 of each plate 71A, 71B form a network of conductors for use in sensing electric fields. In the preferred embodiment, each plate 71A, 71B has the appearance of a comb. The spine of the comb is the common conductor 81, while the teeth of the comb are the fingers 73, which are parallel to each other. Each plate 71A, 71B lies in a flat plane. The plates are parallel to each other. The common conductor 81 of each plate is connected to a lead, which lead is an input 49, 51 into the electronics 33 (see FIG. 4).

Although the fingers of each plate are shown and described as being straight and/or parallel to each other they need not be.

The tip portion of the probe is tapered in order to ease the insertion of the probe 41 between a pair of wires. Both the circuit board 61 and the plates 71A, 71B are tapered. This tapering of the probe 41 is achieved as follows: beginning at an inner end 85 of the probe 41, the lengths (between the first and second ends 77, 79) of the fingers 73 are equal. Traversing from the inner end 85 towards the outer end 83, the lengths of the fingers gradually decrease. The tapered portion of the probe 41 has an outline similar to that of an upside down "V".

Figure 7:
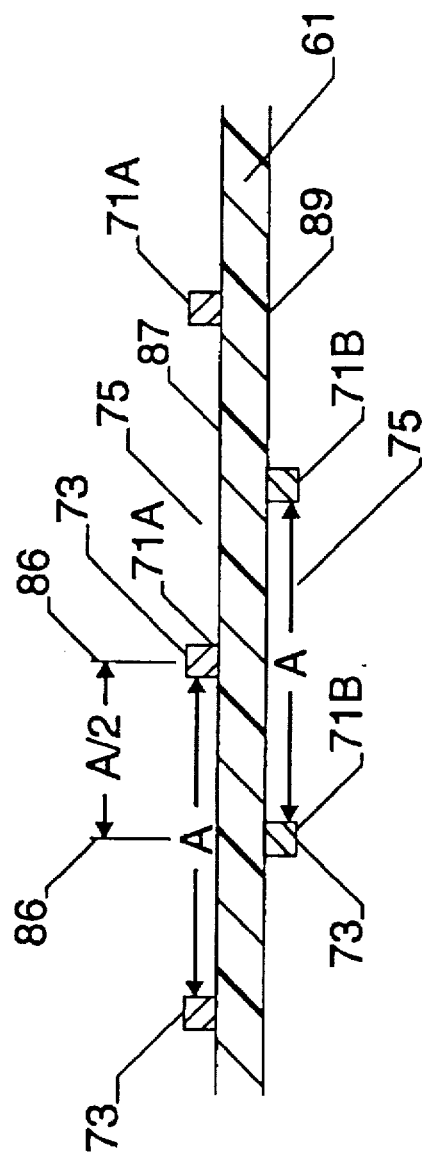
FIG. 7 is a cross-sectional view of portion of the probe, taken along lines VII—VII of FIG. 5.

By providing elongated gaps 75 or slots between the conductive portions of each plate 71A, 71B, the amount of conductive material in each plate is reduced, thereby reducing the capacitance of the probe 41. The fingers of one plate can be aligned with the fingers of the other plate. However, the capacitance of the probe is further reduced by staggering the fingers of the top plate 71A relative to the fingers of the bottom plate 71B. This is shown in FIG. 7. Instead of having the fingers of the bottom plate 71B directly underneath (referring to the orientation of FIG. 7) the fingers of the top plate 71A, the fingers of the bottom plate are offset. Specifically, the fingers of the top plate 71A are spaced apart from each other by distances of A. Likewise, the fingers of the bottom plate 71B are spaced apart from each by distances of A. The distance between imaginary lines 86 that extend through the center of a bottom plate finger 71B and an adjacent top plate 71A finger, which lines are perpendicular to the top and bottom surfaces 87, 89 of the circuit board, is A/2. Thus, the distance between a finger of the top plate 71A and a finger of the bottom plate 71B is the thickness of the circuit board 61 (the distance between the top and bottom surfaces 87, 89) in combination with the staggered distance A/2.

The plates 71A, 71B, with their fingers 73 and common conductors 81, are made on the circuit board 61 in accordance with conventional circuit board etching techniques. Thus, the plates are made of copper plating. A nonconductive film can (not shown) can be located on top of the conductive plates and the gaps between the fingers to prevent accidental short circuiting.

Referring to FIG. 4, the probe 41 is utilized by inserting it between a pair wires 43, 45 such that the wires are parallel to the fingers 73. This provides maximum capacitive coupling between the probe 41 and the wires 43, 45 that are being probed. The fact that the probe 41 extends out from the electronics area 65 (see FIG. 5) of the circuit board 61 makes it unlikely that a user will align the wires in some other orientation.

The probe 41 rejects certain types of noise. One type of noise is common mode noise, wherein a noise signal is common to both the tip and the ring wires 43, 45. Such a common mode noise signal is usually due to coupling (cross-talk) from an adjacent wire pair.

The top and bottom plates 71A, 71B are electrically identical and symmetrical to each other. In addition the plates 71A, 71B are connected to the inputs of a differential amplifier 47 (see FIG. 4). These features allow the realization of a high common mode rejection. Thus, the task of searching for a pair wires is simplified, because the operator is able to distinguish between a pair wires that is actually in service and carrying a signal versus a pair of wires that is not in service but that is carrying a coupled signal. The coupled signal is common to both the tip and the ring wires and is thus rejected by the high common mode rejection probe 41.

Another type of noise is ambient electric fields that are homogeneous. These homogeneous fields can be particularly strong and bothersome. For example, some urban areas have radio stations that transmit at what is believed to be a harmonic of the telephone carrier signal.

Referring to FIGS. 5 and 6, the probe 41 has a guard trace or conductor 91 that extends from the inner end 85 to the outer end 83 of the probe. There is a guard trace 91 adjacent to each plate 71A, 71B. The guard trace 91 is conductive and extends adjacent to the second ends 79 of the fingers 73. There is a small gap 93 between the guard trace 91 and the second ends 79 of the fingers 73 such that the guard trace does not contact the fingers 73. The guard traces 91 are connected to the ground 94 of the electronics 47, 53, 55 (see FIG. 4).

The probe 41 of FIGS. 5 and 6 is well suited for detecting signals of plural frequencies. Plural mixers can be provided, wherein there is one mixer for each type of signal of interest. Thus, there can be a first mixer for a T-1 signal, a second mixer for a T-2 signal, and so on. The detected signal can be split or routed to the appropriate mixer.

Figure 8:
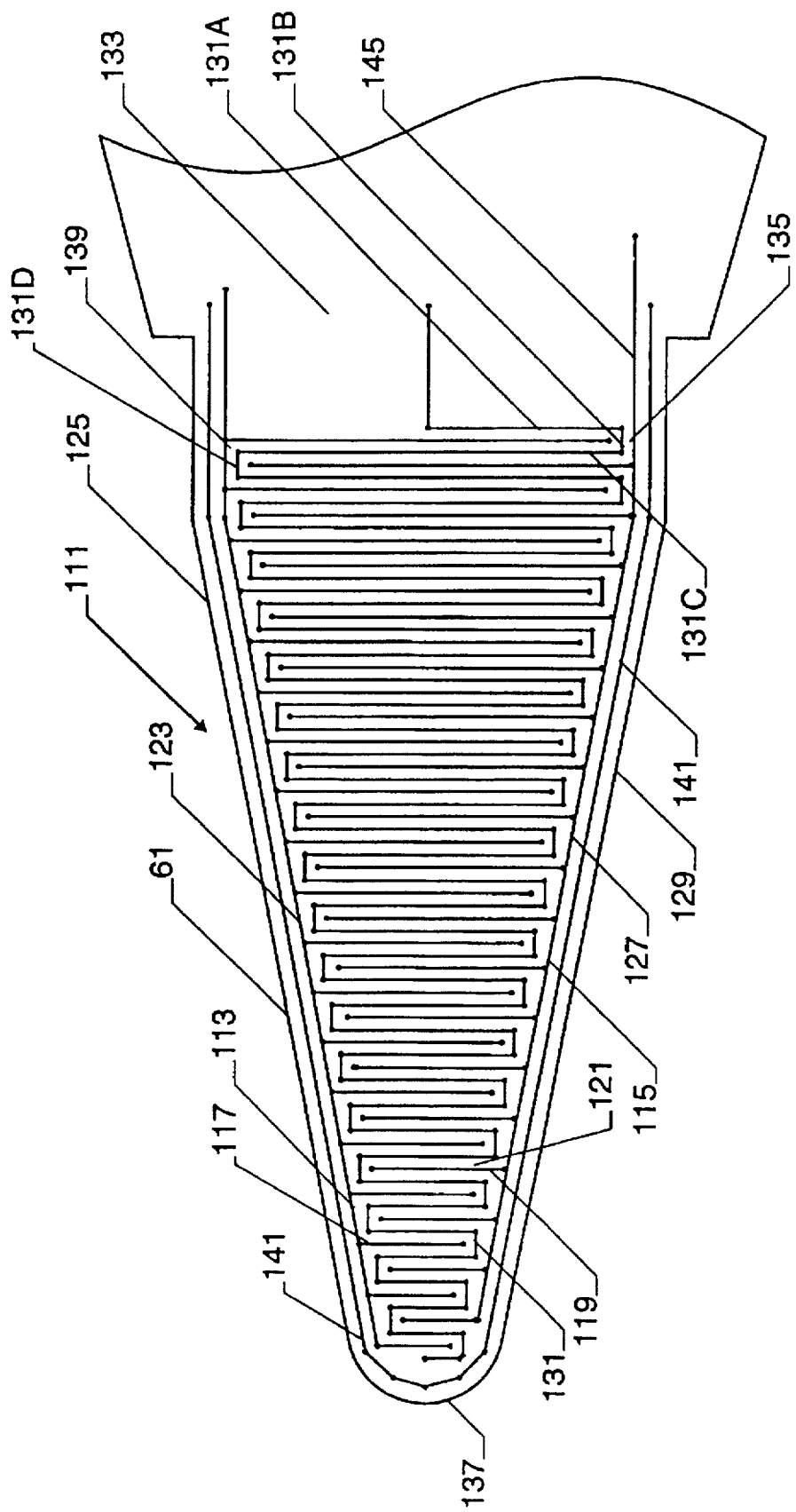
FIG. 8 is a top plan view of a printed circuit board showing one side of the probe of the present invention, in accordance with another embodiment.

The performance of the probe can be optimized for multiple channels or frequencies. Referring to FIG. 8, the probe 111 is similar to the probe 41 of FIGS. 5 and 6 except that plural signal bands can be separately detected. On one side of the circuit board 61, the probe 111 has a first comb shaped plate 113 and a second comb shaped plate 115. Each of the plates 113, 115 have respective parallel conductive fingers 117, 119 that are separated by gaps 121. The fingers 117 of the first plate 113 are interdigitated with the fingers 119 of the second plate 115 such that the fingers 117 of the first plate 113 lie within the gaps 121 between the fingers 119 of the second plate 115 and vice versa. The common conductor 123 of the first plate 113 extends adjacent to a first edge 125 of the circuit board 61 while the common conductor 127 of the second plate 115 extends adjacent to a second edge 129 of the circuit board 61.

The probe also has a third plate 131 that is a conductive wirelike trace extending in a zig zag manner between the fingers 117, 119 of the first and second plates 113, 115. Thus, the third plate 131 extends through the gaps 121 between the first and second plates 113, 115. For example, referring to the inner end 133 of the probe 111, the third plate trace 131A traverses towards the edge 129 of the circuit board 61. At the gap 135 between the finger of the first plate 113 and the common conductor 127 of second plate 115, the third plate trace 131B turns and traverses through the gap 135 towards the outer end 137 of the probe. Before contacting the nearest finger in the second plate 115, the third plate trace 131C turns again and traverses towards the opposite edge 125 of the circuit board between the fingers of the first and second plates. Near the opposite edge 125 of the circuit board, the third plate trace 131D turns again towards the probe outer end 137 and extends through the gap 139 between the common conductor 123 of the first plate 113 and the end of the finger of the second plate. The third plate trace 131E then turns and traverses towards the opposite edge 129 of the circuit board 61, staying between the adjacent fingers of the first and second plate 113, 115. In this manner, the third plate trace zig zags towards the outer end 137 of the probe by traversing the gaps between the first and second plates.

There is also provided a fourth plate trace 141 that extends around the periphery of the first, second, and third plates 113, 115, 131 and adjacent to the edges 125, 137, 129 of the circuit board.

The probe 111 has a top side (shown in FIG. 8) and a bottom side. The bottom side is a mirror image of the top side. The top and bottom sides are located on opposite sides of the circuit board so that the insulation material of the circuit board is interposed between the probe plates or traces. Thus, there is a first plate 113 on each side of the circuit board. Likewise, there is a second plate 115, a third plate 131 and a fourth plate or trace 141 on each side of the circuit board. The first, second, third, and fourth plates or traces on each side of the probe are all separated from each other by gaps. Thus, each plate is electrically independent and unconnected to the other plates.

Figure 9:
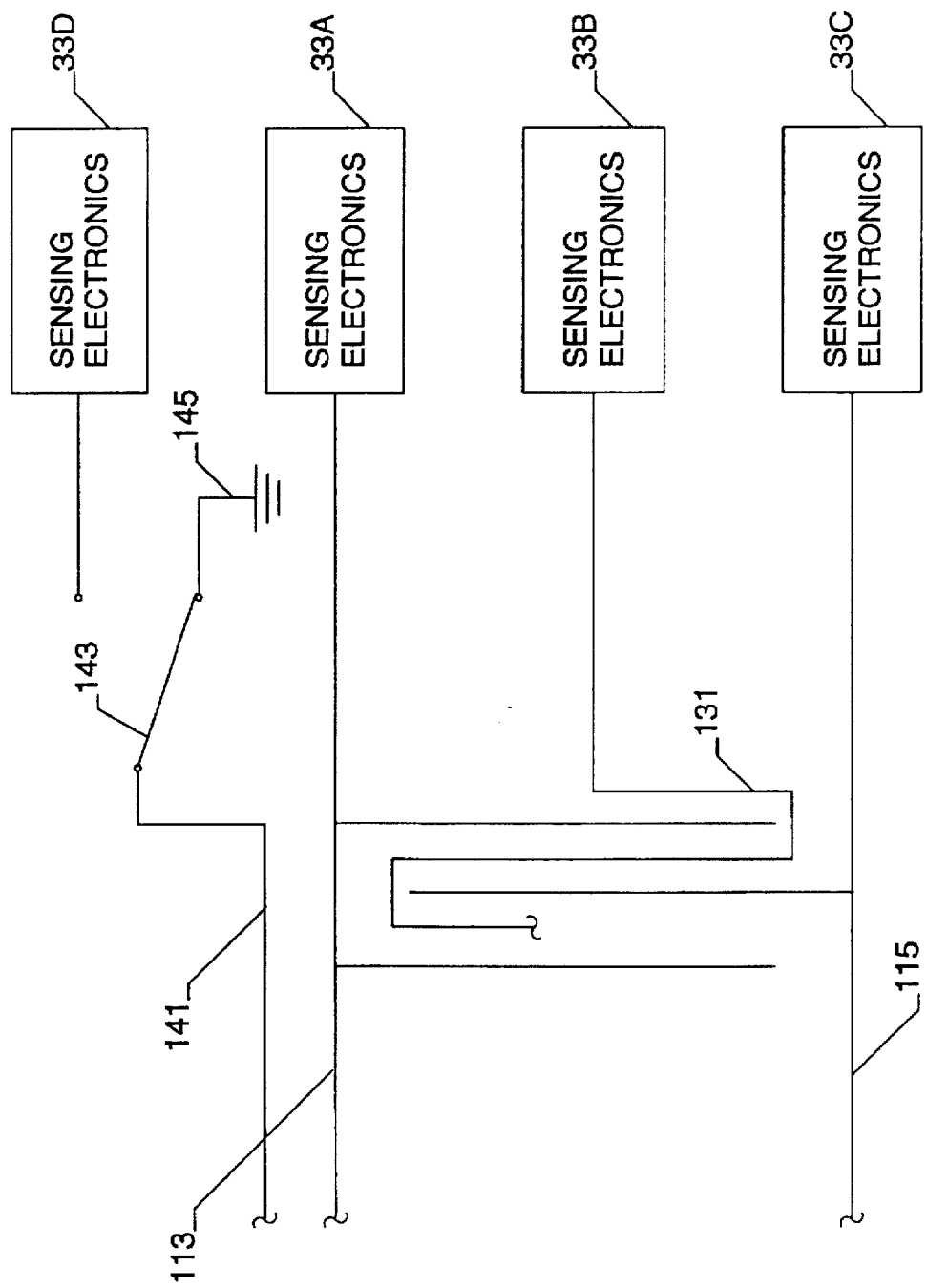
FIG. 9 is a schematic diagram showing how the probe of FIG. 8 is connected to sensing electronics.

Referring to FIG. 9, each plate is connected to respective sensing electronics. For example, the first plate 113 is connected to an input of a first channel of sensing electronics 33A. The first channel of sensing electronics 33A has another input that is connected to the first plate located on the other side of the circuit board 61. Likewise, the second plates 115 are connected to inputs of a second channel of sensing electronics 33B, and the third plates 131 are connected to inputs of a third channel of sensing electronics 33C. The performance of the probe over multiple channels is enhanced because all of the signal collected by a plate (or a pair of plates) is used by the respective sensing electronics. Previous multichannel designs have used the probe to collect a signal, after which the signal is frequency filtered and split to the appropriate sensing electronics. Splitting is not necessary with the probe 111. For example, all of the signal collected by the first plates (top and bottom plates) is used in the sensing electronics 33A. There is no need to split the signal obtained from the first plates.

Each one of the fourth traces 141 is connected to a switch 143. The switch 143 allows the fourth trace 141 to be selectively coupled to circuit ground 145, which is a common ground for the sensing electronics 33A, 33B, 33C wherein the fourth trace 141 serves to snub homogeneous fields, or to sensing electronics 33D for detecting audio, wherein the fourth trace 141 serves as a non-differential probe.

Although the present invention has described as detecting digital signals on the wires 43, 45 (FIG. 4) using a capacitive probe to sample to the electric field of the signals, the magnetic field of the signals on the wire pair can also be sampled in accordance with the present invention. Sampling the electric field has some advantages over sampling the magnetic field. A probe that samples the electric field can detect the differential field produced by a tip and ring wire pair in service and reject the common-mode noise field of a couple signal appearing on the wire pair. In addition, a probe that samples the electric field can be utilized to detect signals where no current is available to produce a magnetic field.

Such a magnetic field probe would have plural magnetic field sensors, such as small coils. Each coil would be connected to a respective input of sensing electronics.

The foregoing disclosure and the showings made in the drawings are merely illustrative of the principles of this invention and are not to be interpreted in a limiting sense.

We claim:

1. A probe for use in sensing electromagnetic fields produced by a pair of wires, comprising:
   a) two conductors that are separated from each other, the two conductors being structured and arranged to be inserted between the pair of wires for capacitive coupling to the pair of wires;
   b) an insulating material that is located between the conductors;
   c) each of the conductors comprising a set of conducting strips, with each of the strips in a respective set being separated from adjacent strips in the same set by gaps that are electrically isolated from the adjacent strips, each of the conductors comprising a connecting conductor that conductively couples the strips in a respective set together at some portion along a length of the strips in the respective set.

2. The probe of claim 1 wherein each of the conductors is shaped like a comb having a spine and teeth projecting from the spine, with the respective connecting conductor forming the spine of the comb and the respective set of strips forming the teeth.

3. The probe of claim 1 wherein each of the conductors comprises a zig zag conductor.

4. The probe of claim 1 further comprising two guard conductors with there being one of the guard conductors located adjacent to one of the two conductors and the other of the guard conductors being located adjacent to the other of the two conductors, with both of the guard conductors being connected to a circuit ground.

5. The probe of claim 1 wherein the strips of one of the conductors are staggered with respect to the strips of the other of the conductors.

6. The probe of claim 1 wherein each of the conductors lies in a flat plane.

7. The probe claim 1 wherein the insulating material comprises a circuit board having first and second opposite surfaces, with one of the two conductors being located on the first surface and the other of the two conductors being located on the second surface.

8. The probe of claim 1 wherein the two conductors comprise a first electrical channel, with the two conductors being first channel conductors and the gaps being first channel gaps, further comprising two second electrical channel conductors that are separated from each other by the insulating material, with each of the second channel conductors comprising a set of second channel conducting strips that are separated from each other by second channel gaps, each of the second channel conductors comprising a second channel connecting conductor that conductively couples the second channel strips in a respective set together at some portion along a length of the second channel strips in the respective second channel conducting strip set, the second channel strips of one of the second channel conductors being located in the first channel gaps of one of the first channel conductors and the second channel strips of the other of the second channel conductors being located in the first channel gaps of the other of the first channel conductors.

9. The probe of claim 8 further comprising two third channel conductors that are parallel to each other and are separated from each other by the insulating material, each of the third channel conductors comprising a zig zag conductor, with the zig zag conductor of one of the third channel conductors being located in the first channel gaps of one of the first channel conductors and in the second channel gaps of one of the second channel conductors and with the zig zag conductor of the other of the third channel conductors being located in the first channel gaps of the other of the first channel conductors and in the second channel gaps of the other of the second channel conductors.

10. The probe of claim 8 further comprising two guard conductors, with there being one of the guard conductors located adjacent to one of the first channel conductors and the other of the guard conductors being located adjacent to the other of the first channel conductors, with both of the guard conductors being connected to a circuit ground.

11. The probe of claim 1 wherein the conducting strips have a strip width that is less than a width of the gaps between the strips.

12. A circuit board for use in detecting signals on telephone cables, comprising:
a) a probe area having a first surface and an opposite second surface, the first surface having a first conductive plate and the second surface having a second conductive plate, with each of the first and second conductive plates having an overall size and having plural nonconductive interstices therein so as to reduce a capacitance between the first and second conductive plates, said probe area being structured and arranged to be inserted between a pair of wires for capacitive coupling to the pair of wires:
b) an electronics area that is integral to and adjacent to the probe area, the electronics area being structured and arranged to receive sensing electronics for use in processing a signal collected by the first and second conductive plates.

13. The circuit board of claim 12 wherein:
a) the probe area has first and second ends, with the first end being coupled to the electronics area and second end being free:
b) the interstices of each of the first and second conductive plates are long and narrow so as to form conductive strips in the first and second conductive plates, the conductive strips being oriented perpendicular to an imaginary line extending between the first and second ends.

14. An apparatus for use in detecting signals on telephone wires, comprising:
a) two conductors that are separated from each other;
b) an insulating material that is located between the conductors;
c) each of the conductors having an overall size and having plural nonconductive interstices therein so as to reduce a capacitance of the two conductors;
d) a signal detector having two inputs, with each of the conductors being connected to one of the inputs, the signal detector also having a human intelligible output.

15. The apparatus of claim 14, wherein:
a) the two conductors are electrically identical and electrically symmetrical;
b) the signal detector comprises a differential amplifier that has the two inputs.

16. A method of sensing a signal in a pair of wires, comprising the steps of:
a) providing a probe having two comb shaped conductors that are separated from each other, the comb shaped conductors having conductive parallel teeth;
b) inserting the probe between the wires in the pair such that the wires are parallel to the conductive teeth;
c) collecting a portion of the signal from the pair of wires with the probe.

17. The probe of claim 2 wherein the strips of one of the conductors are staggered with respect to the strips of the other of the conductors.

18. The probe of claim 2 wherein the probe has an end and two sides that extend from the end, with the probe being structured and arranged so as to be inserted with the end first between the pair of wires, with the teeth of each conductor being oriented so as to extend between the sides, so that the teeth are approximately parallel to the wires when the probe is inserted between the wires.

19. The probe of claim 2 wherein the two conductors comprise a first electrical channel, with the two conductors being first channel conductors and the gaps being first channel gaps, further comprising two second electrical channel conductors that are separated from each other by the insulating material, with each of the second channel conductors comprising comb having a spine and teeth projecting from the spine, with the spine forming a respective connecting conductor and the respective teeth forming conductive strips, wherein each of the first channel conductors is oriented with respect to one of the second channel conductors such that the teeth of the respective first channel conductor are interdigitated with the teeth of the respective second channel conductor.

* * * * *